US006723177B2

(12) United States Patent
Dearnaley et al.

(10) Patent No.: US 6,723,177 B2
(45) Date of Patent: Apr. 20, 2004

(54) LIFE EXTENSION OF CHROMIUM COATING AND CHROMIUM ALLOYS

(75) Inventors: Geoffrey Dearnaley, San Antonio, TX (US); Kevin C. Walter, Aliso Viejo, CA (US)

(73) Assignee: Southwest Research Institute, San Antonio, TX (US)

( * ) Notice: Subject to any disclaimer, the term of this patent is extended or adjusted under 35 U.S.C. 154(b) by 37 days.

(21) Appl. No.: 09/901,364

(22) Filed: Jul. 9, 2001

(65) Prior Publication Data

US 2003/0041924 A1 Mar. 6, 2003

(51) Int. Cl.[7] .............................................. C23C 22/00
(52) U.S. Cl. ...................... 148/246; 148/264; 148/276; 148/277; 148/280; 148/286; 427/419.1; 427/419.2
(58) Field of Search ................ 148/246, 264, 148/276, 277, 280, 286; 427/419.1, 419.2

(56) References Cited

U.S. PATENT DOCUMENTS

| | | | |
|---|---|---|---|
| 2,685,543 A | * | 8/1954 | Sinderbrand ................ 148/278 |
| 3,915,757 A | | 10/1975 | Engel |
| 4,105,443 A | | 8/1978 | Dearnaley et al. |
| 4,181,590 A | | 1/1980 | Fujishiro et al. |
| 4,352,698 A | | 10/1982 | Hartley et al. |
| 4,465,524 A | | 8/1984 | Dearnaley et al. |
| 4,568,396 A | | 2/1986 | Vardiman |
| 4,847,504 A | | 7/1989 | Aitken |
| 5,041,361 A | | 8/1991 | Tsuo |
| 5,224,249 A | | 7/1993 | Kornely, Jr. |
| 5,415,704 A | * | 5/1995 | Davidson ..................... 148/316 |
| 5,449,920 A | | 9/1995 | Chan |
| 5,473,165 A | | 12/1995 | Stinnett et al. |
| 5,527,731 A | | 6/1996 | Yamamoto et al. |
| 5,676,701 A | * | 10/1997 | Yuan et al. .............. 623/17.15 |
| 5,780,862 A | | 7/1998 | Siess |
| 5,882,439 A | * | 3/1999 | Nakahama et al. ......... 148/240 |
| RE36,760 E | | 7/2000 | Bloomquist et al. |
| 6,086,726 A | | 7/2000 | Renk et al. |

FOREIGN PATENT DOCUMENTS

| | | | |
|---|---|---|---|
| JP | 360128269 A | * | 7/1985 |
| JP | 402297466 A | * | 12/1990 |

OTHER PUBLICATIONS

Hay et al., "Instrumented Indentation Testing", ASM Handbook, vol. 8, ASM Handbook Committee, 2000, pp. 1–15.*

* cited by examiner

*Primary Examiner*—Andrew L. Oltmans
(74) *Attorney, Agent, or Firm*—Paula D. Morris & Associates, P.C.

(57) ABSTRACT

A process for treating a chromium coating and/or the surface of a chromium alloy to increase hardness, and/or to decrease coefficient of friction; chromium alloys and/or chromium coatings with surfaces having increased hardness and/or decreased coefficient of friction; and, components comprising chromium alloys and/or chromium coatings with surfaces having increased hardness and/or decreased coefficient of friction.

171 Claims, No Drawings

LIFE EXTENSION OF CHROMIUM COATING AND CHROMIUM ALLOYS

FIELD OF THE INVENTION

The present invention provides a process for treating a chromium alloy or a chromium coating to (a) increase the hardness of the coating or alloy, and/or (b) to increase resistance to friction and wear. The invention also relates to coatings formed using the process, which have superior hardness and friction and wear properties.

BACKGROUND OF THE INVENTION

Replating of chromium coatings is costly and the effluent from typical chromium coating processes is toxic to the environment. In fact, environmental legislation mandates substantial reductions in chromium plating. As a result, processes are needed to prolong the life of chromium coatings and to reduce or eliminate the need for stripping, re-plating, and re-machining chromium coated tools.

One relatively low temperature process that is currently used to prolong the life of chromium coatings is nitrogen ion implantation, which produces a fine dispersion of relatively hard and stable chromium nitrides, CrN and $Cr_2N$. Unfortunately, chromium nitrides are not as hard as many other nitrides. For example, CrN has a bulk hardness of only about 11 GPa, or half the hardness of TiN. Also, high doses of nitrogen ions are required to produce the chromium nitrides. Finally, nitrides do not generally have a low coefficient of friction.

Thermally-sprayed chromium oxide has been used to coat bearings, but the coating is brittle, is not smooth enough for many applications (such as bearings), and presents the problem of decohesion. In addition, thermally-sprayed coatings are generally porous and therefore do not provide good corrosion protection for substrates such as steel. A need exists for chromium alloy surfaces and non-porous chromium coatings with increased bulk hardness and low friction and resistance to wear.

SUMMARY OF THE INVENTION

In one aspect, the invention provides a method of forming a lubricious outer surface comprising chromium, said method comprising:
  providing a substrate comprising a surface comprising chromium, said surface having an initial coefficient of friction in an unlubricated condition against a steel counterface; and
  treating said substrate with an additive comprising an element X under conditions effective to produce a mixture comprising chromium-X molecules and molecules of said substrate adjacent to said lubricious outer surface, wherein said lubricious outer surface comprises a sufficient quantity of said chromium-X molecules to produce a final coefficient of friction in an unlubricated condition against a steel counterface that is less than said initial coefficient of friction of said surface,
  said additive being selected from the group consisting of substituted or unsubstituted metal carbonyls comprising a metal selected from the group consisting of tungsten, molybdenum, chromium, iron, and nickel, wherein said substituted carbonyls comprise an oxygen of the carbonyl substituted by an element selected from the group consisting of X; and compounds having the general formula $$H_nC_mX_o$$

wherein
  n is from about 0 to about 6;
  m is from about 1 to about 2;
  o is from about 1 to about 2; and,
  X is selected from the group consisting of fluorine, oxygen, sulfur, and chlorine.

In another aspect, the invention provides a variety of substrates comprising a gradient from an inside to an outside surface consisting essentially of:
  molecules of said substrate/a mixture comprising said substrate molecules and said chromium-X molecules/a surface comprising a sufficient quantity of said chromium-X molecules to produce a final coefficient of friction in an unlubricated condition against a steel counterface that is less than a virgin coefficient of friction of said surface in the absence of said gradient;
  wherein X is selected from the group consisting of fluorine, oxygen, sulfur, and chlorine.

DETAILED DESCRIPTION OF THE INVENTION

Chromium, particularly electroplated chromium, is one of the most important and widely-used metal coatings. Coatings comprising chromium are used on many automotive parts, aeronautical parts, bearings, such as journal bearings, tools for injection molding of filled polymers, such as plated molds, tools, runner blocks, and the like. Chromium alloys are used in the manufacture of medical devices, such as total joint replacements.

Chromium and its alloys generally comprise an extremely thin film comprising chromium oxide ($Cr_2O_3$) at the surface. This film provides lubricity and corrosion resistance. The present invention provides a method to reinforce this chromium oxide and to provide even more resistance to corrosion. The invention involves treating a coating comprising chromium to prolong the lifetime of the coating by (a) decreasing the coefficient of friction at the surface and/or (b) increasing the coating hardness. Coatings and chromium alloy surfaces formed using the principles of the present invention exhibit superior friction and wear properties, superior corrosion and pitting resistance, and superior hardness compared to chromium coatings and chromium alloy surfaces made or treated using other methods. These superior chromium coatings or chromium alloy surfaces are produced at relatively low temperatures using relatively low dosages of relatively inexpensive "additive."

The substrate for a chromium coating typically is a metal or a metal alloy. Suitable chromium coatings for treatment according to the invention are formed on a substrate using any known means. Examples include, but are not necessarily limited to electroplating, thermal vapor deposition, sputtering, and pulsed laser deposition. Preferably, the coatings are formed by conventional electroplating. The chromium coating may be a single layer coating, or a multilayered coating. Examples of suitable multilayered coatings include, but are not necessarily limited to coatings of alternating layers of Ti and Cr, alternating layers of chromium and amorphous carbon, and the like. Multilayer coatings may be made using any known means, such as alternate vapor or sputter deposition of components.

Also suitable for treatment are chromium alloy substrates that containing significant amounts of chromium, preferably at least about 18 percent chromium. In order to be suitable for treatment, the chromium content of any alloy must be sufficiently high to prevent subsequent corrosion of the alloy due to conversion of a percentage of chromium atoms to chromium carbide or chromium oxide. An example of a material not suitable for treatment is stainless steel containing less than about 18% Cr. The conversion of a portion of this relatively low percentage of chromium atoms to carbides may reduce the chromium content of the stainless steel to a point sufficiently low to allow intergranular corrosion.

The chromium coating or chromium alloy (sometimes collectively referred to as the "substrate") is treated with an "additive." As used herein, the term "additive" is defined as molecules or ions sufficiently small to penetrate a substrate comprising chromium during ion bombardment techniques, and also consisting essentially of components C, X, and optionally H, in the following formula. Suitable additives include, but are not necessarily limited to substituted or unsubstituted metal carbonyls comprising a metal selected from the group consisting of tungsten, molybdenum, chromium, iron, and nickel, wherein said substituted carbonyls comprise an oxygen of the carbonyl substituted by an element selected from the group consisting of X, defined below. Suitable additives also are compounds having the following general formula $$H_n C_m X_o$$

wherein n is from about 0 to about 6, m is from about 1 to about 2, and o is from about 1 to about 2, and X is selected from the group consisting of fluorine, oxygen, sulfur, and chlorine. In a preferred embodiment, X is selected from the group consisting of fluorine, oxygen, and sulfur. In a most preferred embodiment, X is oxygen. Examples of preferred additives include, but are not necessarily limited to carbon monoxide, carbon dioxide, chromium carbonyl [$Cr(CO)_6$], formic acid, methyl alcohol, ethyl alcohol, and acetone. Preferred additives are carbon monoxide and carbon dioxide. A most preferred additive for use in ion bombardment techniques, hereinafter sometimes referred to as "penetration" techniques, is carbon monoxide.

$CO^+_2$ ions are less toxic than carbon monoxide; however, $CO^+_2$ ions also are heavier and result in less penetration into a preformed chromium coating or a chromium alloy than the penetration achieved using carbon monoxide ions at the same energy. Carbon dioxide ions are preferred in applications where penetration depth is less important, such as where the coating is formed using vapor deposition techniques, and the additive is incorporated into the coating as it is formed.

Where the additive must penetrate a preformed chromium coating or a chromium alloy surface, the additive preferably comprises molecules sufficiently small to penetrate through the chromium coating or alloy surface to within about 100 nm of the substrate under the conditions of activation. Preferably, the additive molecules penetrate at least 50 nm from the outer surface, more preferably at least about 150 nm, and most preferably about 250 nm or more.

The chromium coating or chromium alloy (collectively referred to as the "substrate") is treated with the additive comprising a substituent X under conditions effective to produce a gradient from the inside to the outside surface of the substrate consisting essentially of: substrate molecules/a mixture of substrate molecules and chromium-X molecules/a surface comprising a sufficient quantity of said chromium-X molecules to produce a final coefficient of friction in an unlubricated condition against a steel counterface that is less than a virgin coefficient of friction of said surface in the absence of said gradient. In preferred embodiment, X is oxygen, and the gradient consists essentially of: substrate molecules/a mixture of substrate molecules and chromium-oxide molecules/a surface comprising a sufficient quantity of said chromium-oxide molecules to produce a final coefficient of friction in an unlubricated condition against a steel counterface that is less than a virgin coefficient of friction of said surface in the absence of said gradient.

To use a penetration technique, the chromium alloy or chromium coating is cleaned using standard methods to remove superficial contaminants, such as grease. The substrate is placed in a vacuum chamber that has been evacuated to a base pressure of about $10^{-5}$ torr or less. The additive ions are energized and contacted with the substrate under conditions effective to cause at least some of the additive ions to penetrate the substrate and to cause at least some of the substituent to chemically react with chromium atoms in the substrate. A preferred technique for energizing the additive ions is ion implantation, including but not necessarily limited to direct beam ion implantation and plasma source ion implantation.

A standard ion implantation system consists of a source gas as an ion source; a system to move the ions to the target called the delivery system; and an accelerator, which is the combination of the ion source and the delivery system. During direct beam implantation, positive ions are extracted from a plasma of the desired source gas. An energetic beam of the positive ions may be supplied using any suitable means, including but not necessarily limited to a cold cathode ion source in which the gas or vapor is ionized without the need for high temperatures. Examples are a radio frequency fed ion gun and a twin anode ion source. During plasma source implantation, energy is applied to the substrate surface to make that surface the negative electrode of a high voltage system. Positive ions are extracted from the plasma, accelerated toward and penetrate into the substrate surface. Plasmas are generated by glow discharge or radiofrequency means.

In a preferred embodiment, the substrate is bombarded or irradiated, either in a continuous or interrupted fashion, with an energetic beam of ions of the additive comprising oxygen, most preferably carbon monoxide ions. The energy of the ion beam is sufficient to bring about the necessary quantity of penetration and chemical reaction between substrate atoms and oxygen. Typically, the energy is in the range of from about _500 eV to about 200 keV, preferably from about 20 keV to about 150 keV.

The ion dose is important to the resulting chemical composition. In order to achieve the desired final concentration of additive, the ion dose is from about $10^{16}$ ions/cm$^2$ to about $10^{18}$ ions/cm$^2$, and preferably from about $10^{17}$ ions/cm$^2$ to about $3 \times 10^{17}$ ions/cm$^2$. A given concentration of oxygen requires approximately twice the number of carbon monoxide ions as carbon dioxide ions. The duration of bombardment is from about 10 to about 40 minutes. It is preferable that the ion implantation be carried out at temperatures of about 150° C., preferably about 250° C. in order to avoid softening of the chromium substrate at higher temperatures. Implantation at elevated temperature allows for the optimum size and distribution of oxides of chromium near the surface of the chromium.

Where the additive is carbon monoxide or carbon dioxide, the CO$^+$ and/or CO$_2^+$ ions are accelerated by a high voltage source to the target surface. Upon impact with the metal surface, the CO$^+$ and/or CO$_2^+$ ions dissociate with momentum shared between the carbon and oxygen ions. Both are very reactive with chromium, and once equilibrium is reached, stable carbides and oxides of chromium are formed. Relatively small additions of carbon produce considerable strengthening of a chromium coating. In addition to providing wear resistance, the oxide of chromium is exceptionally hard, with a bulk hardness of about 30 GPa, compared to about 11 GPa for chromium nitride.

Chromium is highly resistant to corrosion due to a protective, extremely thin film of oxide. During sliding wear, the surface oxide resists metal-to-metal welding asperities and so reduces adhesive wear and friction. Ion-implanted oxygen atoms reinforce the protective mechanisms by providing a sub-surface reservoir of oxide. Carbides and nitrides do not have low coefficients of friction against steel. The additives that confer the lowest friction coefficients against steel are those with high electronegativities, including but not necessarily limited to fluorine, oxygen, sulfur, and to some extent chlorine. Oxygen is a preferred additive for use with chromium because chromium oxide is more stable than the compounds formed between chromium and the other listed additives.

Preferably a sufficient amount of carbon and/or oxygen is reacted with the chromium coating to reduce the coefficient of friction of the chromium coating or chromium alloy surface from about 0.5 in an unlubricated condition against a steel counterface at a load of about 100 MPa to about 0.3 or less, more preferably to about 0.2 or less, and most preferably to about 0.1 or less. In order to achieve this reduction in coefficient of friction, the final coating preferably is about 10 atomic % to about 40 atomic % oxygen in relation to the chromium content, preferably about 25 atomic % oxygen in relation to the chromium content.

The bulk hardness of chromium nitride is about 11 GPa. Carbon atoms are more effective for hardening a chromium coating or a chromium alloy substrate than nitrogen atoms because carbon atoms are larger and diffuse less rapidly than nitrogen atoms and thus, at a given temperature, cannot segregate so easily to form a second phase carbide precipitate. The local strain introduced into the chromium lattice by introduction of carbon or carbide precipitates is greater than the corresponding local strain for nitrogen precipitates. It is this increased local strain that impedes the movement of dislocations and thereby hardens the material. Furthermore, the precipitates formed by carbides will be smaller than those formed by nitrides under comparable conditions. As a result, the precipitates formed by carbides are more likely to be in an optimum size range of from about 10 atomic % to about 30 nm—a size range of precipitates which maximizes coherency strain and mechanical interaction with any dislocation(s) moving through the chromium lattice. In steel tempered below 300° C., the monoclinic Hägg carbide, $Fe_{22}C$, is formed and is very effective in hardening mechanisms. Another strengthener at low concentrations is $Fe_{23}C_5$. Chromium forms a similar range of carbides to those of iron.

Preferably a sufficient amount of carbon is chemically reacted with the chromium to increase the hardness of the coating to about 15 GPa or more, more preferably about 20 GPa or more, even more preferably to about 25 GPa or more. In order to achieve this level of hardness, the final coating content is preferably from about 10 atomic % to about 30 atomic % carbon in relation to the chromium content, preferably about 20 atomic % carbon in relation to the chromium content.

Persons of ordinary skill in the art will recognize that many modifications may be made to the present invention without departing from the spirit and scope of the invention. The embodiment described herein is meant to be illustrative only and should not be taken as limiting the invention, which is defined in the following claims.

We claim:

1. A method of forming a lubricious outer surface comprising chromium, said method comprising:

providing a substrate selected from the group consisting of a chromium coating and a chromium alloy, said substrate comprising a surface comprising substrate chromium atoms, said surface having an initial coefficient of friction in an unlubricated condition against a steel counterface; and treating said substrate with an additive comprising an element X under conditions effective to react X with said substrate chromium atoms, producing a mixture adjacent to said lubricious outer surface, said mixture comprising molecules of said substrate and chromium-X molecules comprising said substrate chromium atoms, wherein said lubricious outer surface comprises a sufficient quantity of said chromium-X molecules to produce a final coefficient of friction in an unlubricated condition against a steel counterface that is less than said initial coefficient of friction of said surface, said additive being selected from the group consisting of
   substituted or unsubstituted metal carbonyls comprising a metal selected from the group consisting of tungsten, molybdenum, chromium, iron, and nickel, wherein said substituted carbonyls comprise an oxygen of the carbonyl substituted by an element selected from the group consisting of X; and
   compounds having the general formula $$H_nC_mX_o$$

wherein
   n is from about 0 to about 6;
   m is from about 1 to about 2;
   o is from about 1 to about 2; and,
   X is selected from the group consisting of fluorine, oxygen, sulfur, and chlorine.

2. The method of claim 1 wherein X is fluorine.

3. The method of claim 1 wherein X is sulfur.

4. The method of claim 1 wherein X is chlorine.

5. The method of claim 1 wherein said final coefficient of friction is about 0.3 or less.

6. The method of claim 1 wherein said final coefficient of friction is about 0.2 or less.

7. The method of claim 1 wherein said final coefficient of friction is about 0.1 or less.

8. The method of claim 1 wherein said sufficient quantity comprises from about 10 atomic % to about 40 atomic % X in relation to chromium content.

9. The method of claim 1 wherein said sufficient quantity comprises about 25 atomic % X in relation to chromium content.

10. The method of claim 2 wherein said sufficient quantity comprises from about 10 atomic % to about 40 atomic % X in relation to chromium content.

11. The method of claim 2 wherein said sufficient quantity comprises about 25 atomic % X in relation to chromium content.

12. The method of claim 3 wherein said sufficient quantity comprises from about 10 atomic % to about 40 atomic % X in relation to chromium content.

13. The method of claim 3 wherein said sufficient quantity comprises about 25 atomic % X in relation to chromium content.

14. The method of claim 4 wherein said sufficient quantity comprises from about 10 atomic % to about 40 atomic % X in relation to chromium content.

15. The method of claim 4 wherein said sufficient quantity comprises about 25 atomic % X in relation to chromium content.

16. The method of claim 1 wherein said surface comprises an initial hardness and said conditions are effective to produce a final hardness that is greater than said initial hardness.

17. The method of claim 2 wherein said surface comprises an initial hardness and said conditions are effective to produce a final hardness that is greater than said initial hardness.

18. The method of claim 3 wherein said surface comprises an initial hardness and said conditions are effective to produce a final hardness that is greater than said initial hardness.

19. The method of claim 4 wherein said surface comprises an initial hardness and said conditions are effective to produce a final hardness that is greater than said initial hardness.

20. The method of claim 5 wherein said surface comprises an initial hardness and said conditions are effective to produce a final hardness that is greater than said initial hardness.

21. The method of claim 6 wherein said surface comprises an initial hardness and said conditions are effective to produce a final hardness that is greater than said initial hardness.

22. The method of claim 7 wherein said surface comprises an initial hardness and said conditions are effective to produce a final hardness that is greater than said initial hardness.

23. The method of claim 16 wherein said final hardness is about 15 GPa or more.

24. The method of claim 16 wherein said final hardness is about 20 GPa or more.

25. The method of claim 16 wherein said final hardness is about 25 GPa or more.

26. The method of claim 17 wherein said final hardness is about 15 GPa or more.

27. The method of claim 17 wherein said final hardness is about 20 GPa or more.

28. The method of claim 17 wherein said final hardness is about 25 GPa or more.

29. The method of claim 18 wherein said final hardness is about 15 GPa or more.

30. The method of claim 18 wherein said final hardness is about 20 GPa or more.

31. The method of claim 18 wherein said final hardness is about 25 GPa or more.

32. The method of claim 19 wherein said final hardness is about 15 GPa or more.

33. The method of claim 19 wherein said final hardness is about 20 GPa or more.

34. The method of claim 19 wherein said final hardness is about 25 GPa or more.

35. The method of claim 20 wherein said final hardness is about 15 GPa or more.

36. The method of claim 20 wherein said final hardness is about 20 GPa or more.

37. The method of claim 20 wherein said final hardness is about 25 GPa or more.

38. The method of claim 21 wherein said final hardness is about 15 GPa or more.

39. The method of claim 21 wherein said final hardness is about 20 GPa or more.

40. The method of claim 21 wherein said final hardness is about 25 GPa or more.

41. The method of claim 22 wherein said final hardness is about 15 GPa or more.

42. The method of claim 22 wherein said final hardness is about 20 GPa or more.

43. The method of claim 22 wherein said final hardness is about 25 GPa or more.

44. The method of claim 2 wherein said final coefficient of friction is about 0.3 or less.

45. The method of claim 2 wherein said final coefficient of friction is about 0.2 or less.

46. The method of claim 2 wherein said final coefficient of friction is about 0.1 or less.

47. The method of claim 2 wherein said sufficient quantity comprises from about 10 atomic % to about 40 atomic % X in relation to chromium content.

48. The method of claim 2 wherein said sufficient quantity comprises about 25 atomic % X in relation to chromium content.

49. The method of claim 29 wherein said sufficient quantity comprises from about 10 atomic % to about 40 atomic % X in relation to chromium content.

50. The method of claim 29 wherein said sufficient quantity comprises about 25 atomic % X in relation to chromium content.

51. The method of claim 30 wherein said sufficient quantity comprises from about 10 atomic % to about 40 atomic % substituent in relation to chromium content.

52. The method of claim 30 wherein said sufficient quantity comprises about 25 atomic % X in relation to chromium content.

53. The method of claim 31 wherein said sufficient quantity comprises from about 10 atomic % to about 40 atomic % X in relation to chromium content.

54. The method of claim 31 wherein said sufficient quantity comprises about 25 atomic % X in relation to chromium content.

55. The method of claim 44 wherein said surface comprises an initial hardness and said conditions are effective to produce a final hardness that is greater than said initial hardness.

56. The method of claim 45 wherein said surface comprises an initial hardness and said conditions are effective to produce a final hardness that is greater than said initial hardness.

57. The method of claim 46 wherein said surface comprises an initial hardness and said conditions are effective to produce a final hardness that is greater than said initial hardness.

58. The method of claim 55 wherein said final hardness is about 15 GPa or more.

59. The method of claim 55 wherein said final hardness is about 20 GPa or more.

60. The method of claim 55 wherein said final hardness is about 25 GPa or more.

61. The method of claim 56 wherein said final hardness is about 15 GPa or more.

62. The method of claim 56 wherein said final hardness is about 20 GPa or more.

63. The method of claim 56 wherein said final hardness is about 25 GPa or more.

64. The method of claim 57 wherein said final hardness is about 15 GPa or more.

65. The method of claim 57 wherein said final hardness is about 20 GPa or more.

66. The method of claim 57 wherein said final hardness is about 25 GPa or more.

67. The method of claim 3 wherein said final coefficient of friction is about 0.3 or less.

68. The method of claim 3 wherein said final coefficient of friction is about 0.2 or less.

69. The method of claim 3 wherein said final coefficient of friction is about 0.1 or less.

70. The method of claim 3 wherein said sufficient quantity comprises from about 10 atomic % to about 40 atomic % X in relation to chromium content.

71. The method of claim 3 wherein said sufficient quantity comprises about 25 atomic % X in relation to chromium content.

72. The method of claim 41 wherein said sufficient quantity comprises from about 10 atomic % to about 40 atomic % X in relation to chromium content.

73. The method of claim 41 wherein said sufficient quantity comprises about 25 atomic % X in relation to chromium content.

74. The method of claim 42 wherein said sufficient quantity comprises from about 10 atomic % to about 40 atomic % X in relation to chromium content.

75. The method of claim 42 wherein said sufficient quantity comprises about 25 atomic % X in relation to chromium content.

76. The method of claim 43 wherein said sufficient quantity comprises from about 10 atomic % to about 40 atomic % X in relation to chromium content.

77. The method of claim 43 wherein said sufficient quantity comprises about 25 atomic % X in relation to chromium content.

78. The method of claim 67 wherein said surface comprises an initial hardness and said conditions are effective to produce a final hardness that is greater than said initial hardness.

79. The method of claim 68 wherein said surface comprises an initial hardness and said conditions are effective to produce a final hardness that is greater than said initial hardness.

80. The method of claim 69 wherein said surface comprises an initial hardness and said conditions are effective to produce a final hardness that is greater than said initial hardness.

81. The method of claim 78 wherein said final hardness is about 15 GPa or more.

82. The method of claim 78 wherein said final hardness is about 20 GPa or more.

83. The method of claim 78 wherein said final hardness is about 25 GPa or more.

84. The method of claim 79 wherein said final hardness is about 15 GPa or more.

85. The method of claim 79 wherein said final hardness is about 20 GPa or more.

86. The method of claim 79 wherein said final hardness is about 25 GPa or more.

87. The method of claim 80 wherein said final hardness is about 15 GPa or more.

88. The method of claim 81 wherein said final hardness is about 20 GPa or more.

89. The method of claim 81 wherein said final hardness is about 25 GPa or more.

90. A method of forming a lubricious outer surface comprising chromium, said method comprising:
providing a substrate selected from the group consisting of a chromium coating and a chromium alloy, said substrate comprising a surface comprising substrate chromium atoms, said surface having an initial coefficient of friction in an unlubricated condition against a steel counterface;
treating said surface with an additive comprising oxygen under conditions effective to produce a mixture adjacent to said lubricious outer surface, said mixture comprising substrate molecules and chromium-oxide molecules comprising said substrate chromium atoms, said lubricious outer surface consisting essentially of chromium oxide molecules comprising said substrate chromium atoms;
wherein said lubricous outer surface has a final coefficient of friction in an unlubricated condition against a steel counterface that is less than said initial coefficient of friction.

91. The method of claim 90 wherein said final coefficient of friction of said surface is about 0.3 or less.

92. The method of claim 90 wherein said final coefficient of friction of said surface is about 0.2 or less.

93. The method of claim 90 wherein said final coefficient of friction of said surface is about 0.1 or less.

94. The method of claim 90 wherein said additive is selected from the group consisting of carbon monoxide, carbon dioxide, formic acid, methyl alcohol, ethyl alcohol, and acetone.

95. The method of claim 90 wherein said lubricous outer surface comprises from about 10 atomic % to about 40 atomic % oxygen in relation to chromium content.

96. The method of claim 90 wherein said lubricous outer surface comprises about 25 atomic % oxygen in relation to chromium content.

97. The method of claim 91 wherein said lubricous outer surface comprises from about 10 atomic % to about 40 atomic % oxygen in relation to chromium content.

98. The method of claim 91 wherein said lubricous outer surface comprises about 25 atomic % oxygen in relation to chromium content.

99. The method of claim 92 wherein said lubricous outer surface comprises from about 10 atomic % to about 40 atomic % oxygen in relation to chromium content.

100. The method of claim 92 wherein said lubricous outer surface comprises about 25 atomic % oxygen in relation to chromium content.

101. The method of claim 93 wherein said lubricous outer surface comprises from about 10 atomic % to about 40 atomic % oxygen in relation to chromium content.

102. The method of claim 94 wherein said lubricous outer surface comprises about 25 atomic % oxygen in relation to chromium content.

103. The method of claim 94 wherein said lubricous outer surface comprises from about 10 atomic % to about 40 atomic % oxygen in relation to chromium content.

104. The method of claim 90 wherein said lubricous outer surface comprises about 25 atomic % oxygen in relation to chromium content.

105. The method of claim 90 wherein said surface comprises an initial hardness and said conditions are effective to produce a final hardness that is greater than said initial hardness.

106. The method of claim 91 wherein said surface comprises an initial hardness and said conditions are effective to produce a final hardness that is greater than said initial hardness.

107. The method of claim 92 wherein said surface comprises an initial hardness and said conditions are effective to produce a final hardness that is greater than said initial hardness.

108. The method of claim 93 wherein said surface comprises an initial hardness and said conditions are effective to produce a final hardness that is greater than said initial hardness.

109. The method of claim 94 wherein said surface comprises an initial hardness and said conditions are effective to produce a final hardness that is greater than said initial hardness.

110. The method of claim 105 wherein said final hardness is about 15 GPa or more.

111. The method of claim 105 wherein said final hardness is about 20 GPa or more.

112. The method of claim 105 wherein said final hardness is about 25 GPa or more.

113. The method of claim 106 wherein said final hardness is about 15 GPa or more.

114. The method of claim 106 wherein said final hardness is about 20 GPa or more.

115. The method of claim 106 wherein said final hardness is about 25 GPa or more.

116. The method of claim 107 wherein said final hardness is about 15 GPa or more.

117. The method of claim 107 wherein said final hardness is about 20 GPa or more.

118. The method of claim 107 wherein said final hardness is about 25 GPa or more.

119. The method of claim 108 wherein said final hardness is about 15 GPa or more.

120. The method of claim 108 wherein said final hardness is about 20 GPa or more.

121. The method of claim 108 wherein said final hardness is about 25 GPa or more.

122. The method of claim 109 wherein said final hardness is about 15 GPa or more.

123. The method of claim 109 wherein said final hardness is about 20 GPa or more.

124. The method of claim 109 wherein said final hardness is about 25 GPa or more.

125. A method of forming a hard surface comprising chromium, said method comprising:
providing a substrate selected from the group consisting of a chromium coating and a chromium alloy comprising substrate chromium atoms, said substrate comprising a surface having an initial hardness;
treating said surface with an additive comprising an element selected from the group consisting of oxygen, carbon, and a combination thereof under conditions effective to produce a final surface having a final hardness greater than said initial hardness, said final surface comprising a mixture adjacent to an outer surface, said mixture comprising substrate molecules and molecules selected from the group consisting of chromium oxide, chromium carbide, and a combination thereof, wherein said chromium consists essentially of said substrate chromium atoms.

126. The method of claim 125 wherein said additive is selected from the group consisting of carbon monoxide, carbon dioxide, formic acid, methyl alcohol, ethyl alcohol, and acetone.

127. The method of claim 125 wherein said additive is selected from the group consisting of carbon monoxide ions and carbon dioxide ions.

128. The method of claim 125 wherein said additive is carbon monoxide ions.

129. The method of claim 125 wherein said final hardness is about 15 GPa or more.

130. The method of claim 125 wherein said final hardness is about 20 GPa or more.

131. The method of claim 125 wherein said final hardness is about 25 GPa or more.

132. The method of claim 126 wherein said final hardness is about 15 GPa or more.

133. The method of claim 126 wherein said final hardness is about 20 GPa or more.

134. The method of claim 126 wherein said final hardness is about 25 GPa or more.

135. The method of claim 127 wherein said final hardness is about 15 GPa or more.

136. The method of claim 127 wherein said final hardness is about 20 GPa or more.

137. The method of claim 127 wherein said final hardness is about 25 GPa or more.

138. The method of claim 128 wherein said final hardness is about 15 GPa or more.

139. The method of claim 128 wherein said final hardness is about 20 GPa or more.

140. The method of claim 128 wherein said final hardness is about 25 GPa or more.

141. A method for making a medical implant comprising:
providing a component of a medical implant comprising a substrate comprising a surface comprising substrate chromium atoms, said surface having an initial coefficient of friction in an unlubricated condition against a steel counterface;
treating said surface with an additive comprising oxygen under conditions effective to produce a mixture adjacent to a lubricious outer surface comprising substrate molecules and chromium-oxide molecules consisting essentially of said substrate chromium atoms, said surface having a final coefficient of friction in an unlubricated condition against a steel counterface that is less than said initial coefficient of friction.

142. The method of claim 141 wherein said final coefficient of friction of said surface is about 0.3 or less.

143. The method of claim 141 herein said final coefficient of friction of said surface is about 0.2 or less.

144. The method of claim 141 wherein said final coefficient of friction of said surface is about 0.1 or less.

145. The method of claim 141 wherein said surface comprises from about 10 atomic % to about 40 atomic % oxygen in relation to chromium content.

146. The method of claim 141 wherein said surface comprises about 25 atomic % oxygen in relation to chromium content.

147. The method of claim 142 wherein said surface comprises from about 10 atomic % to about 40 atomic % oxygen in relation to chromium content.

148. The method of claim 142 wherein said surface comprises about 25 atomic % oxygen in relation to chromium content.

149. The method of claim 143 wherein said surface comprises from about 10 atomic % to about 40 atomic % oxygen in relation to chromium content.

150. The method of claim 143 wherein said surface comprises about 25 atomic % oxygen in relation to chromium content.

151. The method of claim 144 wherein said surface comprises from about 10 atomic % to about 40 atomic % oxygen in relation to chromium content.

152. The method of claim 144 wherein said surface comprises about 25 atomic % oxygen in relation to chromium content.

153. The method of claim 141 wherein said surface comprises an initial hardness and said conditions are effective to produce a final hardness that is greater than said initial hardness.

154. The method of claim 142 wherein said surface comprises an initial hardness and said conditions are effective to produce a final hardness that is greater than said initial hardness.

155. The method of claim 143 wherein said surface comprises an initial hardness and said conditions are effective to produce a final hardness that is greater than said initial hardness.

156. The method of claim 144 wherein said surface comprises an initial hardness and said conditions are effective to produce a final hardness that is greater than said initial hardness.

157. The method of claim 141 wherein said final hardness is about 15 GPa or more.

158. The method of claim 141 wherein said final hardness is about 20 GPa or more.

159. The method of claim 141 wherein said final hardness is about 25 GPa or more.

160. The method of claim 142 wherein said final hardness is about 15 GPa or more.

161. The method of claim 142 wherein said final hardness is about 20 GPa or more.

162. The method of claim 142 wherein said final hardness is about 25 GPa or more.

163. The method of claim 143 wherein said final hardness is about 15 GPa or more.

164. The method of claim 143 wherein said final hardness is about 20 GPa or more.

165. The method of claim 143 wherein said final hardness is about 25 GPa or more.

166. The method of claim 144 wherein said final hardness is about 15 GPa or more.

167. The method of claim 144 wherein said final hardness is about 20 GPa or more.

168. The method of claim 144 wherein said final hardness is about 25 GPa or more.

169. A method of forming a lubricious chromium coating comprising:

providing a substrate selected from the group consisting of a chromium coating and a chromium alloy, said substrate comprising a surface comprising substrate chromium atoms, said surface having an initial hardness and an initial coefficient of friction in an unlubricated condition against a steel counterface;

means for reducing said initial coefficient of friction and for increasing said initial hardness.

170. A method of forming a hard chromium coating comprising:

providing a chromium coating having an initial hardness; and means for increasing said initial hardness.

171. A method of forming a chromium alloy comprising a lubricious outer surface, said method comprising:

providing a chromium alloy substrate, said substrate comprising a surface comprising substrate chromium atoms, said surface having an initial hardness and an initial coefficient of friction in an unlubricated condition against a steel counterface;

means for reducing said initial coefficient of friction and for increasing said initial hardness.

* * * * *